(12) United States Patent
Jonsson et al.

(10) Patent No.: US 7,008,265 B2
(45) Date of Patent: Mar. 7, 2006

(54) CIRCUIT BOARD CONNECTOR

(75) Inventors: Stefan Jonsson, Stocksund (SE); Dan Karlsson, Solna (SE); Tord Liljevik, Bromma (SE)

(73) Assignee: Allgon AB, Taby (SE)

( * ) Notice: Subject to any disclaimer, the term of this patent is extended or adjusted under 35 U.S.C. 154(b) by 0 days.

(21) Appl. No.: 10/473,138

(22) PCT Filed: Feb. 13, 2002

(86) PCT No.: PCT/SE02/00244

§ 371 (c)(1),
(2), (4) Date: Jan. 29, 2004

(87) PCT Pub. No.: WO02/084808

PCT Pub. Date: Oct. 24, 2002

(65) Prior Publication Data

US 2004/0171301 A1      Sep. 2, 2004

(30) Foreign Application Priority Data

Apr. 11, 2001   (SE) .................................... 0101303

(51) Int. Cl.
*H01R 9/05* (2006.01)
(52) U.S. Cl. .................................................. 439/581
(58) Field of Classification Search ................ 439/581, 439/578, 59, 63; 361/778
See application file for complete search history.

(56) References Cited

U.S. PATENT DOCUMENTS

| | | | | |
|---|---|---|---|---|
| 3,201,721 A | * | 8/1965 | Voelcker | 333/33 |
| 4,401,356 A | * | 8/1983 | Bare | 439/329 |
| 5,532,659 A | | 7/1996 | Dodart | 333/260 |
| 5,667,390 A | * | 9/1997 | Keng | 439/76.1 |
| 6,068,501 A | * | 5/2000 | Knighton et al. | 439/328 |
| 6,123,550 A | * | 9/2000 | Burkert et al. | 439/63 |
| 6,575,762 B1 | * | 6/2003 | Evans | 439/63 |
| 6,804,122 B1 | * | 10/2004 | Wong et al. | 361/777 |
| 6,932,659 B1 | * | 8/2005 | Wong | 439/853 |

FOREIGN PATENT DOCUMENTS

GB      2187898 A      9/1987

* cited by examiner

*Primary Examiner*—Alexander Gilman
(74) *Attorney, Agent, or Firm*—Jacobson Holman PLLC

(57) ABSTRACT

The invention generally relates to a connector (1) for receiving a cable end (12), arranged for being attached to a circuit board. The connector is provided with a through hole (10) for receiving the cable end, at least one upper lip (5) and at least one lower lip (3) with a connector recess (11, 13) therebetween for fitting onto an edge of a slit (6) in the circuit board. The connector is further provided with at least one snap holding element (4), disposed adjacent to said connector recess (11, 13), so as to engage with a portion (7) of the circuit board, adja-cent to the edge of the slit 6 in the circuit board.

10 Claims, 3 Drawing Sheets

CIRCUIT BOARD CONNECTOR

This is a nationalization of PCT/SE02/00244 filed Feb. 13, 2002 and published in English.

FIELD OF THE INVENTION

The present invention relates to a circuit board connector according to the introductory portion of claim 1. It further relates to a circuit board with a circuit board connector according to claim 10. Specifically, the invention concerns a circuit board connector for receiving a cable end, and arranged for being attached to a circuit board.

BACKGROUND OF THE INVENTION

A number of circuit board connectors for receiving a cable end, such as a coaxial cable, and arranged for being attached to a circuit board and electrically connecting the cable to the circuit board components, are available. Such a connector is intended for holding the free end of a cable conductor, such that it is not detachable from the connector while still relieving the free cable conductor end of mechanical stress, and electrically connecting the cable conductor to the circuit board. The connectors may have further purposes, such as electrically shielding the free cable conductor end, and fixing the wave guiding properties of the connection between the free cable conductor and the circuit board by a well defined geometry of the connector.

A particular difficulty in achieving electrical properties that are consistent for a series of connector units, is fixing the position of the connector with a large degree of accuracy. Small shifts in the position of the connector and of the electrical conductor, which is connected, to the circuit board, particularly in the general direction of the cable end, will cause comparatively large changes in the electrical properties. This sensitivity to small position changes increases with increasing frequency, and the sensitivity is very large in the microwave region.

Often, this is solved by inserting the connector terminals into snugly fit through holes on the circuit board. The terminals are then attached to the circuit board by soldering. This has the disadvantage that the connector is partially held in place by way of soldering.

SUMMARY OF THE INVENTION

A general object of the invention is to provide a circuit board connector, which solves the problem, discussed above and which can be attached to the circuit board with a large degree of positioning accuracy, and be held in place without soldering.

This object is attained with a circuit board connector having the features of claim 1.

Accordingly, the invention generally relates to a connector for receiving a cable end arranged for being attached to a circuit board. The connector is provided with a through hole for receiving the cable end, at least one upper lip and at least one lower lip with a connector recess therebetween for fitting onto an edge of a slit in said circuit board. The connector is further provided with at least one snap holding element disposed adjacent to the connector recess so as to engage with a portion of the circuit board, adjacent to said edge of said slit in the circuit board.

According to another aspect of the invention, the connector is electrically conducting, and thus establishes an electrical connection between the cable shield and the lower side of the circuit board through the lower lip. This is particularly advantageous if the ground plane of the circuit board is located on the lower side of the circuit board.

The invention will now be explained further below with reference to the appended drawings.

DESCRIPTION OF PREFERRED EMBODIMENTS

Figure 1:
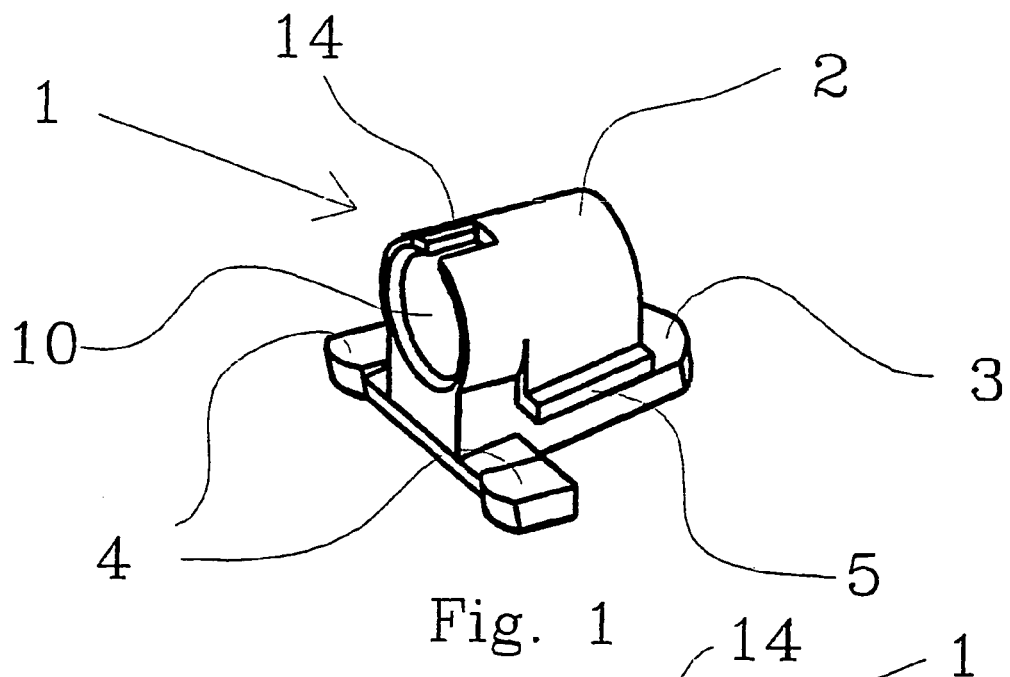
FIG. 1 shows the rear face and the side of a connector according to the invention.
Figure 2:
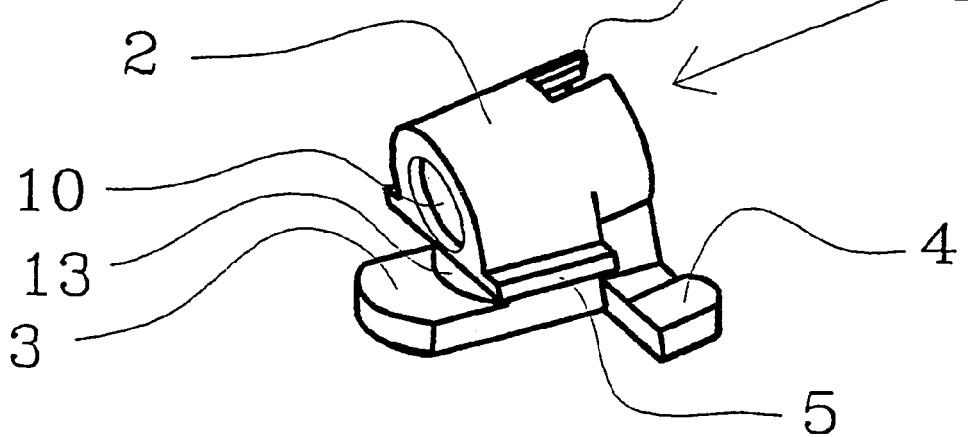
FIG. 2 shows the front face and the side of a connector according to the invention.
Figure 3:
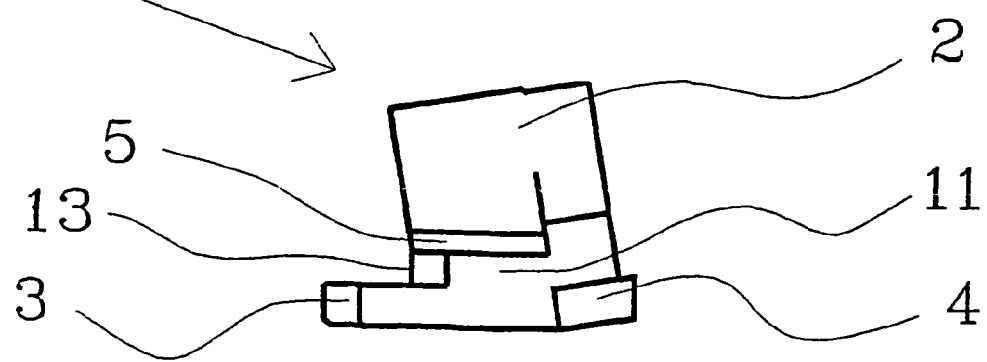
FIG. 3 shows a connector according to the invention in a side view.
Figure 7:
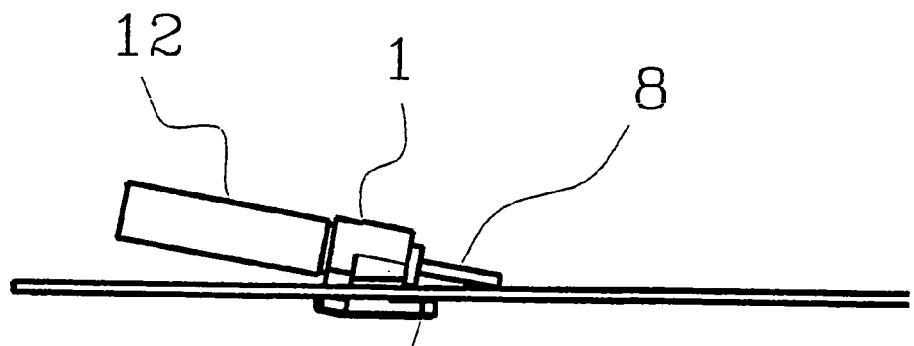
FIG. 7 shows a side view of a connector according to the invention on a circuit board.
Figure 8:
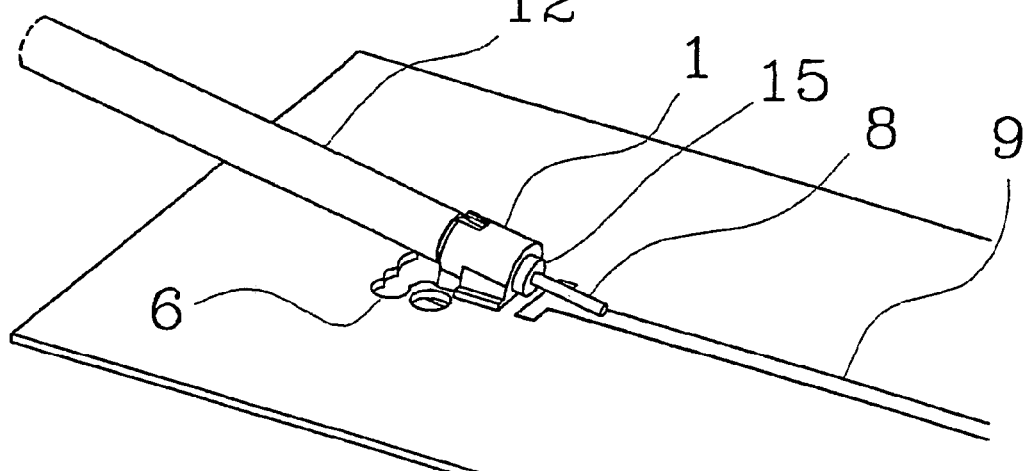
FIG. 8 shows a perspective view of the connector of FIG. 7 on a circuit board.
Figure 9:
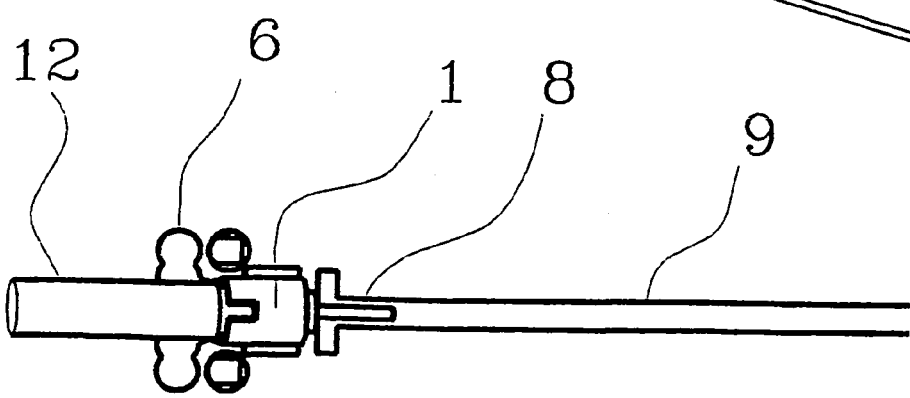
FIG. 9 shows the connector of FIG. 7 on the circuit board in a top view.

FIGS. 1–3 show close-up views of a connector 1 according to the invention, from three different angles. The connector comprises a hole 10 extending through a connector body 2 for receiving a cable end. Upon assembly, the shield of the cable is electrically connected to the body 2 by soldering into a slot 14. The body 2 is provided with two upper lips 5 and a lower lip 3, which extend sideways and forwards from the body respectively. These lips 5, 3 are situated on the upper side and the lower side of a circuit board, respectively, when the connector is attached to the circuit board (FIGS. 7–9). Between the upper and lower lips there is a recess 11, 13, which is designed to precisely fit onto the edge of a slit 6 in the circuit board, so that the lips 5, 3 hold the connector 1 on the circuit board and prevent translational movements in the vertical direction.

In the embodiment shown, the upper lips 5 are located at a longitudinal distance from the lower lip 3. However, alternatively the upper lips 5 may be placed immediately above the lower lip 3, and thus be directly separated by the recess 11.

The recess 11 is designed to allow the connector to slide longitudinally forwards into the slit 6 of the circuit board as far as the slit extends. Sideways movement of the connector is prevented by the width of the slit 6. According to the invention, the connector 1 also has two snap holding elements 4 extending sideways from the body at essentially the same height as the lower lip 3. In conjunction with the lips 5 and the lower lip 3, the elements 4 hold the connector in place on the circuit board, when positioned in its final, locking position. The snap holding elements 4 will force the circuit board to bend upwards somewhat as the connector is inserted into the circuit board slit, and upon pushing the connector forwards into its final position, the snap holding elements 4 will snap into corresponding holes 7 through the circuit board, these holes 7 serving as locking portions. The front surface 13 of the recess 11 prevents the connector from sliding forwards further, while the snap holding elements 4 prevent the connector from sliding backwards.

Figure 4:
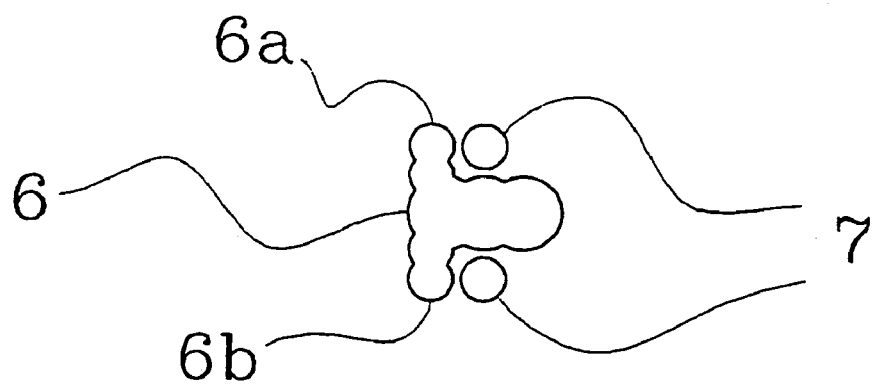
FIG. 4 shows the outline of through holes in a circuit board for receiving a connector according to the invention.
Figure 5:
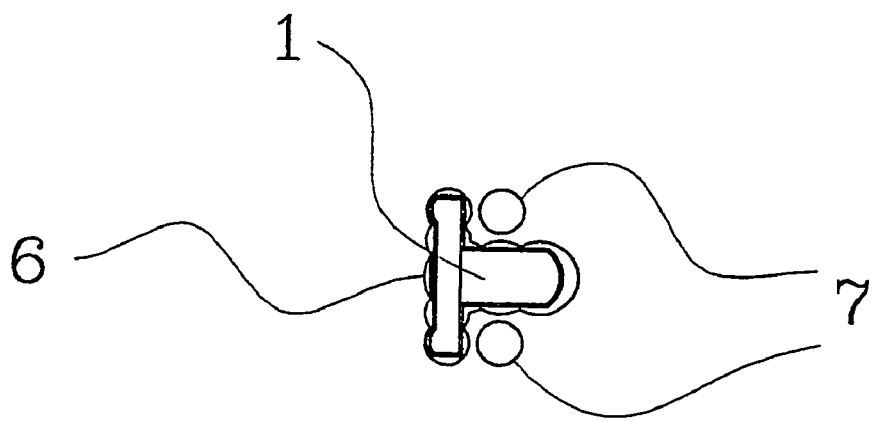
FIG. 5 shows a circuit board from below, where the through holes are receiving a connector according to the invention.
Figure 6:
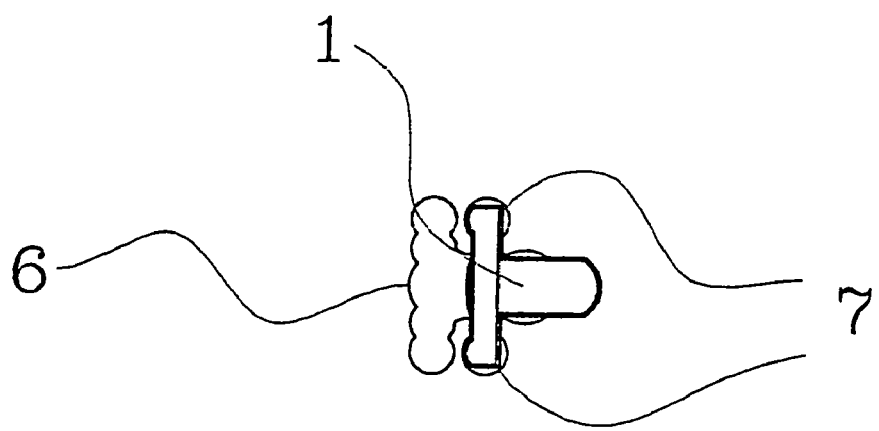
FIG. 6 shows a circuit board from below, with a connector according to the invention in a locked position.

The engagement of the connector with the locking portion 7 is more clearly illustrated in FIGS. 4–6. FIG. 4 shows the outline of the slit 6 in the circuit board, and the locking portions 7. The slit 6 is designed to receive the lower lip 3, and is provided with side extensions 6a, 6b for receiving the snap holding elements 4. FIG. 5 shows the slit 6 from the lower side of the circuit board, where the connector has been inserted into the slit, but not yet been pushed into its locked position. In FIG. 6, the connector, upon being inserted into the slit, has been pushed forward into its locked position, where the snap holding elements 4 engage into the holes 7, and the front surface 13 of the recess 11 abuts against the inner edge portion of the slit 6. The through holes 7 and the slit 6 may be fabricated by drilling using drill steels of two different diameters, or alternatively by milling.

FIGS. 7–9 show three views of a connector in its locked position on the circuit board with the cable mounted in the connector, from three different angles. The connector is held in place by its engagement with the slit 6 and the through holes 7, with minimal play. The inner conductor 8 of the cable extends forwardly towards a microstrip conductor 9, and is held in place by the connector 1. The shield of the cable is in direct electrical contact with the conducting connector, and is thereby in electrical contact with the lower lip 3. The inner conductor 8 of the cable may now be soldered to the microstrip conductor 9, and the lower lip 3 and the snap holding elements are soldered to a ground plane on the lower side of the circuit board. The solder is not mechanically stressed if the connector is exposed to a force by, for example, the cable being pulled in a direction from the circuit board. Instead, the forces are received by the circuit board itself.

As shown in FIG. 8, the insulating core 15 of the cable (e.g. made of Teflon) extends somewhat outside the hole 10 to maintain a secure isolation distance between the shield and the inner conductor of the cable.

In FIGS. 4–6 and 8–9, the slit 6 is shown as an essentially T-shaped through hole in the circuit board and the locking portions 7, are shown as round through holes in the circuit board, but these may alternatively be differently shaped, as long as they receive, hold and lock the connector on the circuit board. One such alternative embodiment is a slit 6, which extends directly from a straight edge of the circuit board, where the wider portion of the slit 6a, 6b (the top bar in the "T") is lacking.

As shown in FIG. 5, the wider portion 6a, 6b receives the connector when being inserted from above. The locking portions 7 may alternatively be embodied as recesses instead of through holes, they may extend from the slit instead of being separate, or they may be embodied as hooks extending somewhat into the slit co-operating with correspondingly designed snap holding elements 4.

An advantage of using a conducting connector according to the invention is the relatively large surface of the connector along which the ground current is conducted in a well defined way with low current density from the shield of the cable, via the connector to the ground plane of the circuit board. In this way low intermodulation effects will be obtained. The high frequency ground current from the cable shield may easily flow from the whole circumference of the shield to the lower lip. A further advantage of the illustrated embodiment is its low height upon assembly.

The connector according to the invention may be manufactured by for example casting of zinc or some other metal or alloy. Surface coating with for example copper and silver will enhance the electrical properties further, in particular with regard to low intermodulation levels.

What is claimed is:

1. A connector for receiving a cable end, and arranged for being attached to a circuit board, said connector comprising a connector body and being provided with
   a through hole for receiving said cable end,
   at least one upper lip and at least one lower lip with a connector body recess therebetween for fitting onto an edge of a slit in said circuit board, characterised in that
   the connector body is further provided with at least one snap holding element extending outwardly from said connector body and disposed adjacent to said connector body recess, so as to engage with a portion of the circuit board, adjacent to said edge of said slit (6) in the circuit board, and to resiliently hold the connector in place on the circuit board.

2. The connector according to claim 1, characterised in that said connector body recess is arranged to receive said slit edge in a longitudinal direction being essentially parallel to the direction of the centre axis of said through hole, said recess having a front surface abutting against said edge.

3. The connector according to claims 1, characterised in that said snap holding element is arranged to lockingly engage with said portion, such that said connector is prevented from moving in the direction along which said recess receives said slit edge.

4. The connector according to claim 1, characterised in that said snap holding element is arranged on the lower side of said connector body recess.

5. The connector according to claim 1, characterised in that it is provided with two snap holding elements, which extend outwardly sideways.

6. The connector according to claim 1, characterised in that each snap holding element is arranged to fit into a recess forming said circuit board portion.

7. The connector according to claim 1, characterised in that the snap holding element(s) and the lips are spaced from each other longitudinally.

8. A combination of a circuit board and the connector according to claim 1, characterised in that said slit in the circuit board is an essentially T-shaped hole.

9. The connector according to claim 1, characterised in that the interior surface of said through hole is electrically connected to said upper and lower lips.

10. The connector according to claim 9, characterised in that said lower lip is adapted to electrically contact a ground plane on the lower side of said circuit board.

* * * * *